US008400743B2

(12) United States Patent
Kosonocky et al.

(10) Patent No.: US 8,400,743 B2
(45) Date of Patent: Mar. 19, 2013

(54) ELECTROSTATIC DISCHARGE CIRCUIT

(75) Inventors: Stephen V. Kosonocky, Ft. Collins, CO (US); Warren R. Anderson, Westborough, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 316 days.

(21) Appl. No.: 12/827,017

(22) Filed: Jun. 30, 2010

(65) Prior Publication Data

US 2012/0002334 A1 Jan. 5, 2012

(51) Int. Cl.
*H02H 9/00* (2006.01)
(52) U.S. Cl. .......................................................... 361/56
(58) Field of Classification Search ...................... 361/56
See application file for complete search history.

(56) References Cited

U.S. PATENT DOCUMENTS

| | | | |
|---|---|---|---|
| 6,867,957 B1 | 3/2005 | Tong | |
| 6,924,673 B2 | 8/2005 | Tanishima | |
| 6,947,267 B2* | 9/2005 | Liu et al. | 361/56 |
| 7,423,472 B2 | 9/2008 | Hirose | |
| 7,511,550 B2 | 3/2009 | Bhattacharya | |
| 7,576,964 B2* | 8/2009 | Nakahara | 361/91.1 |
| 7,692,907 B2 | 4/2010 | Chen | |
| 7,809,925 B2* | 10/2010 | Mejdrich et al. | 712/7 |
| 2005/0064829 A1* | 3/2005 | Kang et al. | 455/127.1 |
| 2008/0067995 A1* | 3/2008 | Chua-Eoan et al. | 323/284 |
| 2008/0074171 A1* | 3/2008 | Bhattacharya et al. | 327/538 |
| 2008/0239780 A1* | 10/2008 | Sasaki et al. | 365/51 |
| 2011/0080678 A1* | 4/2011 | Zhao et al. | 361/56 |

OTHER PUBLICATIONS

International Search Report and Written Opinion in application No. PCT/US2011/042362 mailed Sep. 30, 2011.

\* cited by examiner

*Primary Examiner* — Jared Fureman
*Assistant Examiner* — Scott Bauer
(74) *Attorney, Agent, or Firm* — Meyertons Hood Kivlin Kowert & Goetzel; Erik A. Heter (57) ABSTRACT

An integrated circuit (IC) is disclosed. The IC includes a first global voltage node and a second global voltage node. The IC further includes two or more power domains each coupled to the first global voltage node. Each of the two or more power domains includes a functional unit and a local voltage node coupled to the functional unit. Each of the plurality of power domains further includes a power-gating transistor coupled between the local voltage node and the second global voltage node, and an ESD (electrostatic discharge) circuit configured to detect an occurrence of an ESD event and further configured to cause activation of the transistor responsive to detecting the ESD event.

17 Claims, 7 Drawing Sheets

Fig. 7

ELECTROSTATIC DISCHARGE CIRCUIT

BACKGROUND

1. Field of the Invention

This invention relates to electronic circuits, and more particularly, to circuits for protecting against damage from electrostatic discharge (ESD).

2. Description of the Related Art

One of the hazards of handling electronic devices is that resulting from electrostatic discharge (ESD). ESD is a sudden increase in electrical current between two points at different electrical potentials from a field of static electricity. Contact between the two points may provide a discharge path for the electric field. Since the potential difference between the two points may be very large, the current resulting from ESD may also be very large.

Semiconductor devices (e.g., integrated circuits) are particularly vulnerable to damage from ESD. During the manufacturing process, and later in the field, the handling of semiconductor devices and/or assemblies may result in ESD events. Such ESD events can damage or destroy semiconductor devices. Personnel that handle electronic devices and assemblies may take precautions, such as the use of grounding straps or the wearing of grounded shoes, in order to prevent ESD from damaging handled components. However, these precautions may not always be sufficient. Accordingly, many modern electronic devices are designed with ESD protection built in. One type of ESD circuit is referred to as an ESD clamp. An ESD clamp may include an RC (resistive-capacitive) circuit coupled between a power node and a ground node, and a relatively large transistor having a gate terminal coupled to the junction of the resistor and the capacitor of the RC circuit. When an ESD event occurs, the voltage on the junction of the RC circuit may activate the transistor, thereby providing a discharge path for the current from the discharge.

SUMMARY OF EMBODIMENTS OF THE DISCLOSURE

An integrated circuit (IC) is disclosed. In one embodiment, the IC includes a first global voltage node and a second global voltage node. The IC further includes two or more power domains each coupled to the first global voltage node. Each of the two or more power domains includes a functional unit and a local voltage node coupled to the functional unit. Each of the plurality of power domains further includes a transistor coupled between the local voltage node and the second global voltage node, and an ESD (electrostatic discharge) circuit configured to detect an occurrence of an ESD event and further configured to cause activation of the transistor responsive to detecting the ESD event.

In one embodiment, a method includes an ESD (electrostatic discharge) circuit detecting an ESD event. The ESD circuit is associated with one of a plurality of power domains of an IC), wherein each of the plurality of power domains is associated with a corresponding one of a plurality of ESD circuits and is coupled between a first global voltage node and a second global voltage node. The method further includes providing a discharge path between the second global voltage node a local voltage node of the one of plurality of power domain responsive to detecting the ESD event.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

The present disclosure is directed to ESD (electrostatic discharge) protection for an integrated circuit (IC) having multiple power domains that may be selectively and independently powered on or off for the purposes of conserving power. In each power domain, an ESD detection circuit may be implemented in order to detect ESD events. Upon detecting an ESD event, the ESD detection circuit may generate a signal to activate a power-gating transistor, which may thereby complete a discharge path for the current generated by the ESD event. The ESD detection circuit of each power domain may also be coupled to a power control unit of the IC. A selected power domain may be powered up responsive to the power control unit providing a first indication to its respective ESD detection circuit, thereby activating the power-gating transistor. Similarly, the selected power domain may be powered down responsive to the power control unit providing a second indication to the ESD detection circuit, which may in turn deactivate the power-gating transistor. Accordingly, the power-gating transistor, in addition to its function of applying or removing power from a corresponding power domain, may also be used for ESD protection purposes. This may in turn obviate the need to provide extra transistors specifically for the purpose of ESD protection, thereby resulting in area savings on an IC die. Various embodiments of such an IC will now be discussed in further detail.

For the purposes of this disclosure, an ESD event may be defined as any sudden increase in electrical current between two points at different electrical potentials resulting from a field of static electricity. When such ESD events occur in an electronic circuit (e.g., in an IC), they may cause damage to circuitry therein in the absence of a discharge path.

A global voltage node may be defined, for the purposes of this disclosure, as any voltage node (e.g., voltage supply node, ground node) that is coupled to two or more power domains of an IC or other type of electronic system in which circuitry therein may be powered on or off independently of circuitry in other power domains. A local voltage node for the purposes of this disclosure may be defined as a voltage node that is local to the circuitry of a particular power domain, and is thus not coupled to circuitry in another power domain. Thus, for the purposes of this disclosure, applying power to a particular power domain may include coupling a local voltage node of that power domain to a corresponding global voltage node (e.g., coupling a local voltage supply node to a global voltage supply node).

Figure 1:
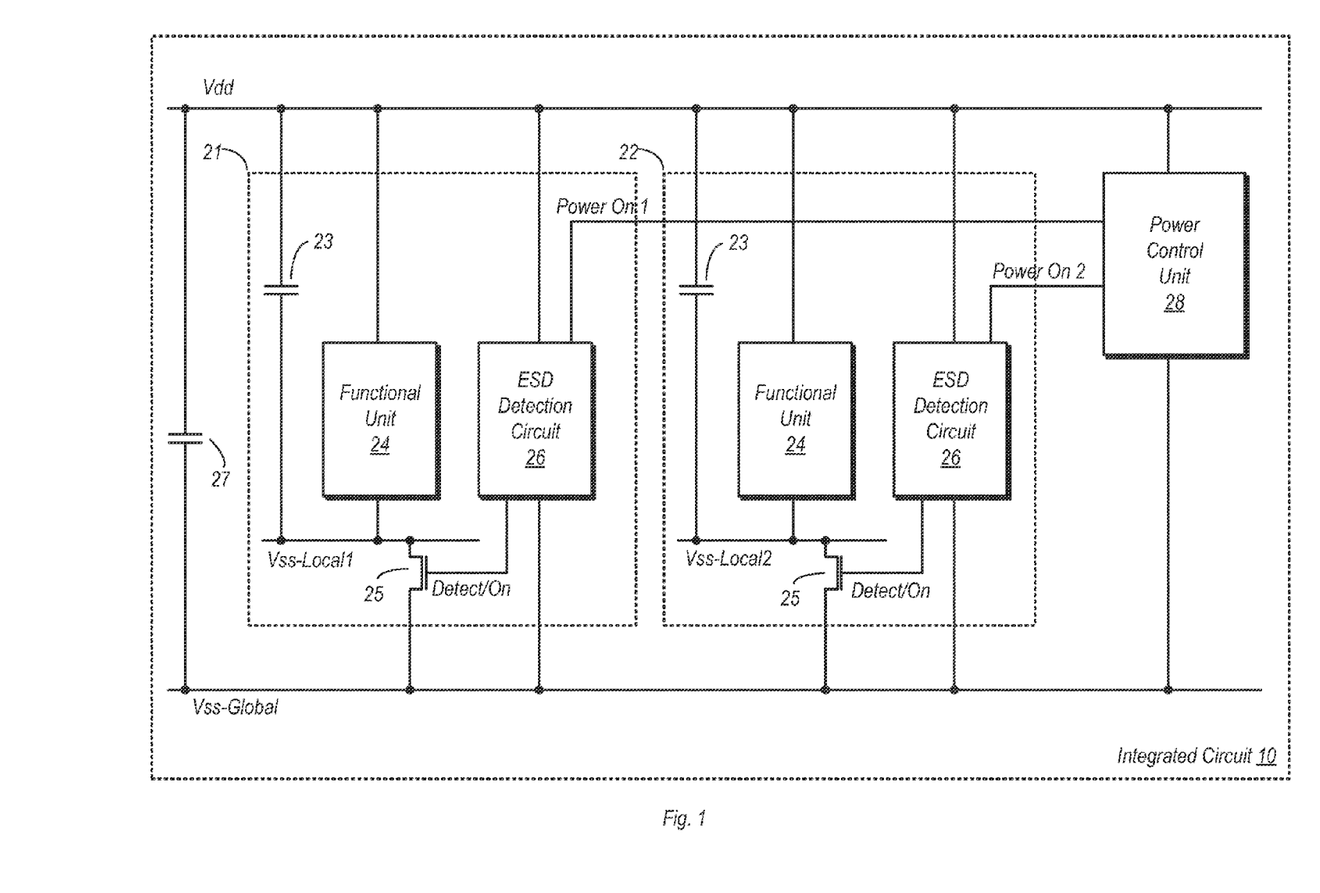
FIG. 1 is a diagram illustrating one embodiment of an integrated circuit (IC) having a plurality of power domains which each utilize a power-gating transistor to provide an ESD discharge path.

IC and ESD Circuit Embodiments:

FIG. 1 is a diagram illustrating one embodiment of an IC having a plurality of power domains which each utilize a power-gating transistor to provide an ESD discharge path. In the embodiment shown, IC 10 includes a first power domain 21 and a second power domain 22. The exact number of power domains in a given embodiment may vary, and thus the example shown here is not intended to be limiting. Each of power domains 21 and 22 in the embodiment shown is coupled to receive a voltage from a global voltage supply node, Vdd. In addition, IC 10 includes a second voltage node, Vss, which serves as a global return voltage node. A decoupling capacitance 27 may be provided between the global voltage supply node and the global voltage return node. Decoupling capacitance 27 may be implemented using one or more capacitors, and may be distributed across IC 10. Power supply noise may be shunted to the return node through decoupling capacitance 27, thereby maintaining the voltage difference between the global voltage supply node and the global voltage return node at a substantially constant value.

Each of the power domains 21 and 22 in the embodiment shown include a local return node, Vss-Local 1 and Vss-Local 2, respectively. A local decoupling capacitance 23 comprised of one or more capacitors may be provided in each of power domains 21 and 22. These capacitors may provide a similar function to that of the global decoupling capacitance 27 described above, and may also provide a portion of a discharge path for current generated from an ESD event, as will be described in further detail below.

Respective power-gating transistors 25 are coupled between the local return nodes of power domains 21 and 22, and the global return node, Vss. A particular one of power domains 21 and 22 may be powered on by activating its corresponding power-gating transistor 25, which may effectively couple its local return node to the global return node Vss. It is noted that power domains 21 and 22 may be powered on and off independently of one another.

IC 10 may be one of many different type of IC's that includes multiple power domains that may be powered on or off independently of one another. For example, IC 10 may in one embodiment be a multi-core processor with each functional unit 24 comprising the circuitry that makes up the core. In another embodiment, IC 10 may be an IC intended for use in a portable device in which preserving battery power is critical, with each power domain including a corresponding functional unit 24 that may be powered off when not in use. It should be noted that functional units 24 may be identical in some embodiments of IC 10, while in other embodiments, functional units 24 may be different from one another. In general, IC 10 may be any type of IC which includes portions (e.g., power domains) that may be powered on or off independently of other portions. Similarly, functional unit 24 may be any type of functional circuitry that performs one or more intended functions of IC 10.

Each of power domains 21 and 22 in the embodiment shown may be powered on by activation of its corresponding power-gating transistor 25. In the embodiment shown, each power-gating transistor 25 has a gate terminal coupled to a respective ESD detection circuit 26. Each ESD detection circuit 26 is coupled to receive a respective signal from power control unit 28. When an ESD detection circuit 26 receives a respective power on signal (e.g., Power On 1 to power domain 21, Power on 2 to power domain 22), it may respond by asserting a signal ('Detect/On') that is received on the gate terminal of the power-gating transistor 25 of that power domain. These signals may be de-asserted by their respective ESD detection circuit 26 responsive to de-assertion of a respective power on signal by power control unit 28. Accordingly, power control unit 28 may effectively control whether or not power is provided to power domains 21 and 22 during normal operation of IC 10.

The assertion of a 'Detect/On' signal on the gate terminal of a power-gating transistor 25 may in turn activate that transistor, thus effectively coupling its local return voltage node to the global return voltage node. For example, if power-gating transistor 25 of power domain 21 is activated, Vss-Local1 may effectively be coupled to Vss-Global, thereby enabling power to be provided to functional unit 24. Conversely, de-assertion of a signal on the gate terminal of a power-gating transistor 25 may remove power therefrom. For example, if the signal provided to the gate terminal of power-gating transistor 25 in power domain 21 is de-asserted, Vss-Local1 is effectively decoupled from Vss-Global, and thus power may be removed from that power domain.

In addition to the power-gating functions described above, power-gating transistors 25 may also be used to complete a discharge path for current generated during an ESD event. Each ESD detection circuit 26 may be configured to detect ESD events that might otherwise be potentially damaging to the circuitry in each of power domains 21 and 22. Responsive to detection of an ESD event, an ESD detection circuit 26 may assert its corresponding 'Detect/On' signal, thereby activating the power-gating transistor 25 of its respective power domain. When the power-gating transistor 25 of power domains 21 and 22 are active, a discharge path for current may be provided, through the capacitance 23, to the local voltage return node (e.g., Vss-Local1) and through the active power-gating transistor 25.

Accordingly, the power-gating transistors 25 in the embodiment shown may provide the functionality of providing an ESD discharge path in addition to their function of performing the power-gating function previously described. Using power-gating transistors to provide an ESD discharge path in the manner described may obviate the need for providing separate transistors to perform this function. This may thus enable the provision of ESD protection of an IC such as IC 10, while also saving circuit area that might otherwise be consumed by separate ESD transistors, which can be relatively large.

Figure 2:
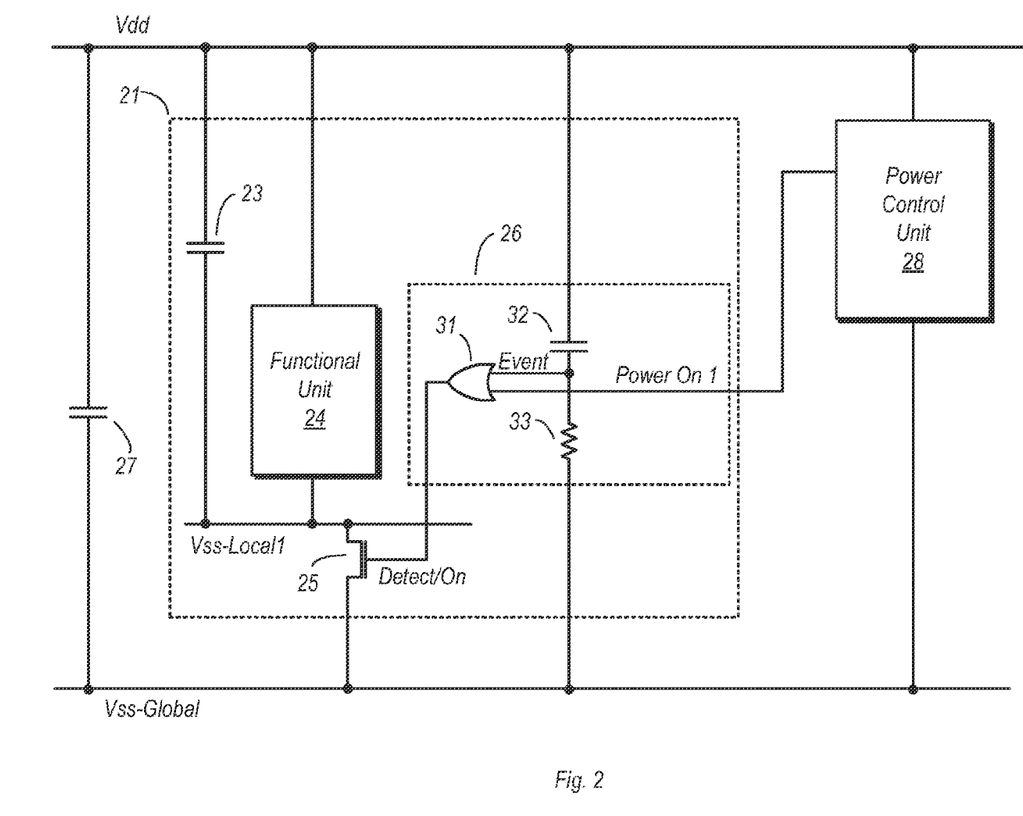
FIG. 2 is a diagram illustrating one embodiment of an ESD circuit in an IC.

FIG. 2 is a diagram illustrating one embodiment of ESD circuit 26 of IC 10. For the sake of illustration, additional elements are shown in FIG. 2 in order to fully illustrate the relationship of ESD detection circuit 26 to these other elements, which are numbered here as in FIG. 1 for the sake of convenience.

In the embodiment shown, ESD detection circuit 26 includes a capacitor 32 and a resistor 33 coupled in series. A junction of capacitor 32 and resistor 33, i.e. the node labeled 'Event', is used as an input to OR gate 31. Capacitor 32 in the embodiment shown is coupled between the Event node and the global voltage supply node. Resistor 33 is coupled between the Event node and the global return voltage node. In the absence of an ESD event, the Event node may be decoupled from the voltage present on the global voltage supply node Vdd by capacitor 32. Thus the Event node may be pulled toward the voltage present on the global voltage return node, Vss-Global, through resistor 33. Furthermore, if Power On 1 is not asserted by power control unit 28, then the output of OR gate 31 may be low in the absence of an ESD event. The gate terminal of power-gating transistor 25, which is coupled to the output of OR gate 31, is thus low in the absence of an ESD event when Power On 1 is not asserted. In this embodiment, power-gating transistor 25 is an NMOS (n-channel metal oxide semiconductor) transistor that may activate responsive to a logic high voltage on its gate terminal. Accordingly, power-gating transistor 25 is thus inactive when the output of OR gate 31 is low.

When an ESD event occurs, the voltage difference between Vdd and Vss-Global may increase rapidly. Since the voltage across a capacitor cannot change instantaneously, the amount of current flowing through resistor 33 may increase rapidly in response to the ESD event. This sudden rush of current through resistor 33 may thus increase the corresponding voltage drop between the Event node and Vss-Global. If the voltage drop is sufficient, OR gate 31 may interpret the voltage present on the Event node as a logic 1. Responsive thereto, OR gate 31 may assert a logic 1 (i.e. a logic high voltage in this case), thereby causing the activation of power-gating transistor 25. As previously noted, the activation of power-gating transistor 25 may effectively couple the local voltage return node (Vss-Local1 in this example) to the Vss-Global. Thus, the activation of power-gating transistor 25 responsive to detection of the ESD event may thus complete a discharge path between Vdd and Vss-Global through the power domain (power domain 21 in this example). Providing a discharge path through power domain 21 when it is otherwise inactive may thus prevent ESD damage to the circuitry contained therein (e.g., functional unit 24).

Figure 3:
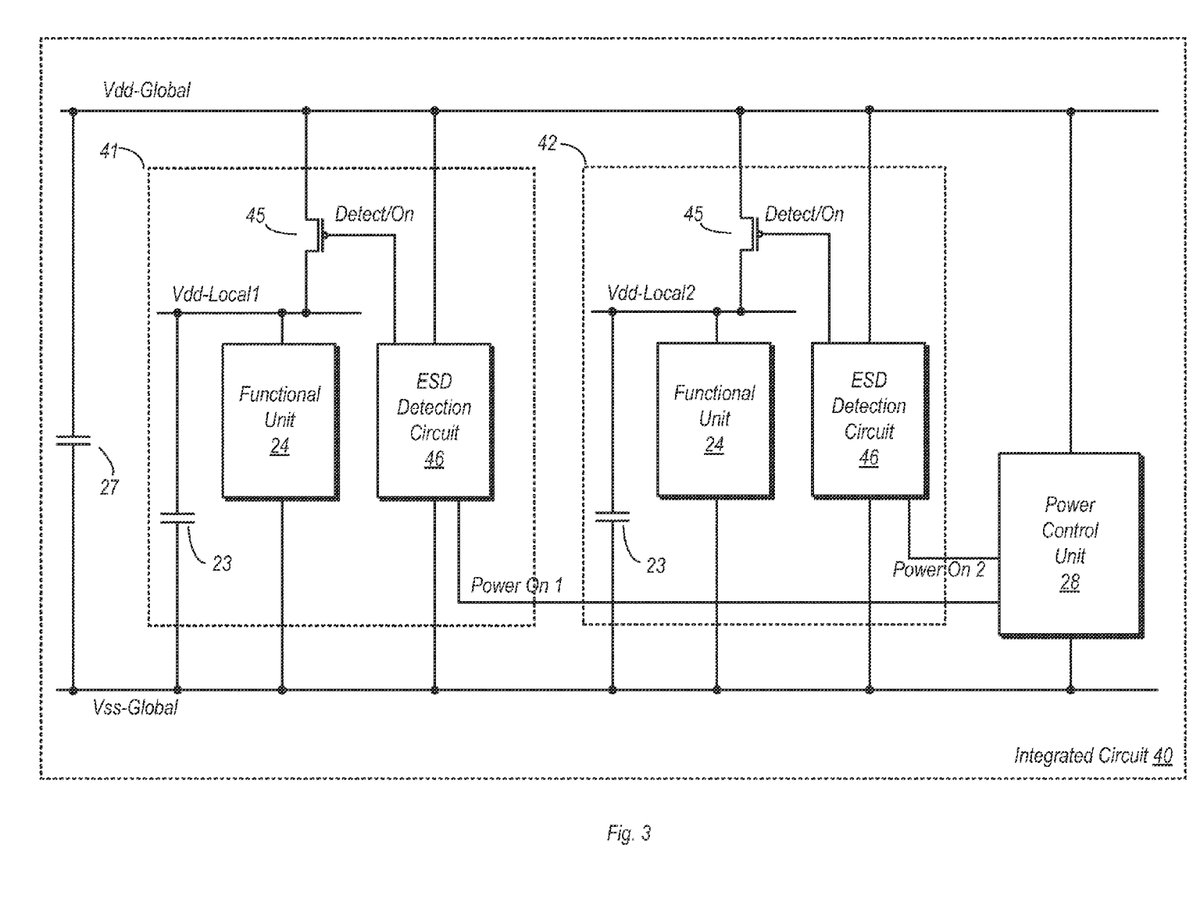
FIG. 3 is a diagram illustrating another embodiment of an IC having a plurality of power domains which each utilize a power-gating transistor to provide an ESD discharge path.

FIG. 3 is a diagram illustrating another embodiment of an IC having a plurality of power domains which each utilize a power-gating transistor to provide an ESD discharge path. In this particular embodiment, IC 40 includes power domains 41 and 42. Each of power domains 41 and 42 include a corresponding functional unit 24, corresponding local decoupling capacitors 23, corresponding power-gating transistors 45, and corresponding ESD detection circuits 46. Power control unit 28 and decoupling capacitance 27 in the embodiment shown are analogous to like-numbered elements shown in FIGS. 1 and 2.

In the embodiment shown, IC 40 includes a global voltage supply node, Vdd-Global and a global voltage return node, Vss-Global. Power domains 41 and 42 each include local voltage supply nodes, Vdd-Local1 and Vdd-Local2, respectively. Corresponding power-gating transistors 45 are coupled between their respective local voltage supply nodes and global supply voltage node Vdd. In contrast to the embodiments illustrated in FIGS. 1 and 2, power-gating transistors are PMOS (p-channel metal oxide semiconductor) transistors. Moreover, referring momentarily to FIG. 4, ESD detection circuit 46 utilizes NOR gate 57 instead of an OR gate 31 as utilized in ESD detection circuit 26 of FIGS. 1 and 2. Thus, when an ESD event occurs, a logic 1 detected on the Event node may cause NOR gate 57 to drive its output low and thus activate the corresponding power-gating transistor 45 coupled thereto. When a power-gating transistor 45 is activated in either of power domains 41 and 42, the corresponding local voltage supply node may effectively be coupled to the global voltage supply node. Thus, a discharge path for current from an ESD event may be provided through the active power-gating transistor 45 and the corresponding local decoupling capacitor 23, which is coupled between Vss-Global and the local voltage supply node for that particular power domain.

Figure 4:
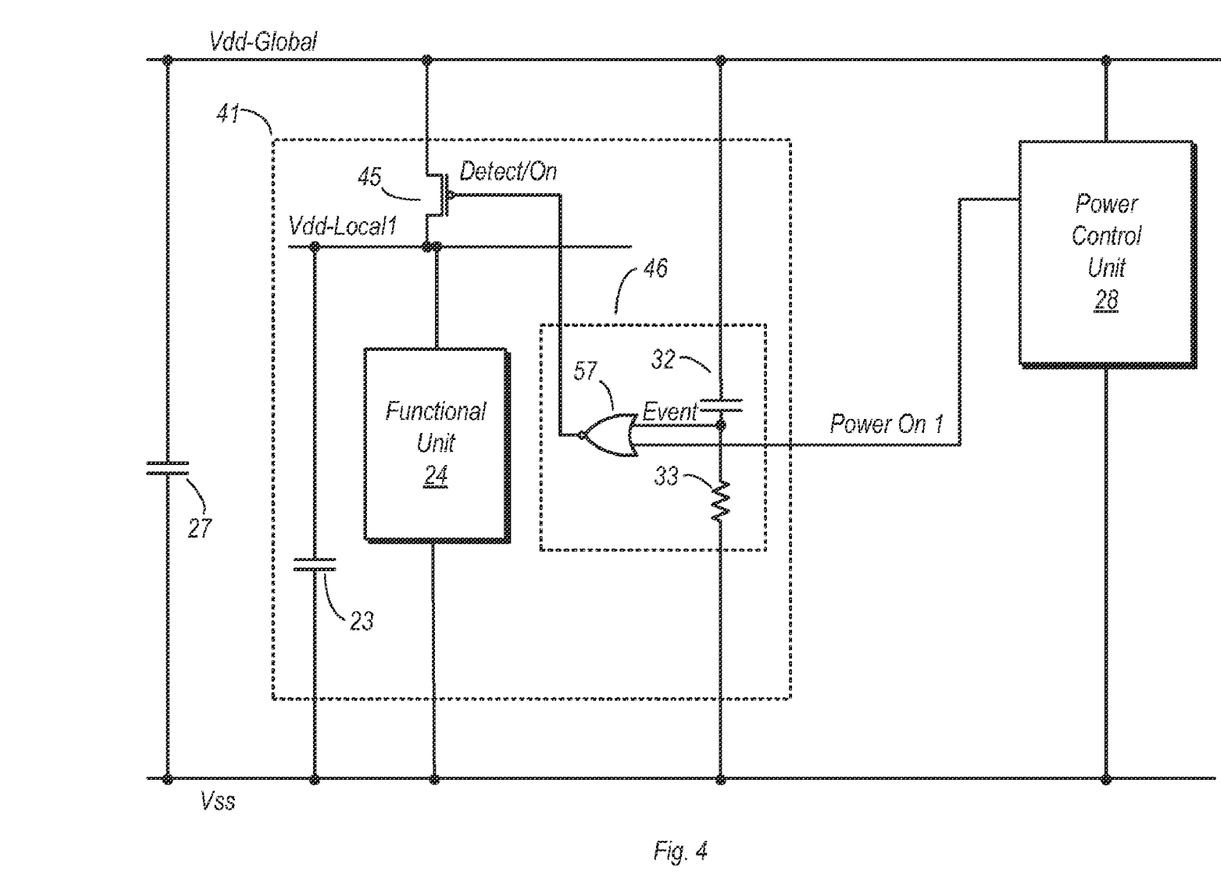
FIG. 4 is a diagram illustrating another embodiment of an ESD circuit in an IC.

Power-gating transistor 45 for each of power domains 41 and 42 may also be activated responsive to ESD detection circuit 45 receiving a corresponding signal from power control unit 28 (e.g., Power On 1 to ESD detection circuit 46 of power domain 41). Thus, the assertion of the Power On 1 signal provided to ESD detection circuit 46 of power domain 41 may cause NOR gate 57 to drive its output low and thus activate the corresponding power-gating transistor 45. Operation of ESD circuit 46 based on receiving an asserted Power On 2 signal from power control unit 28 may be the same.

Figure 5:
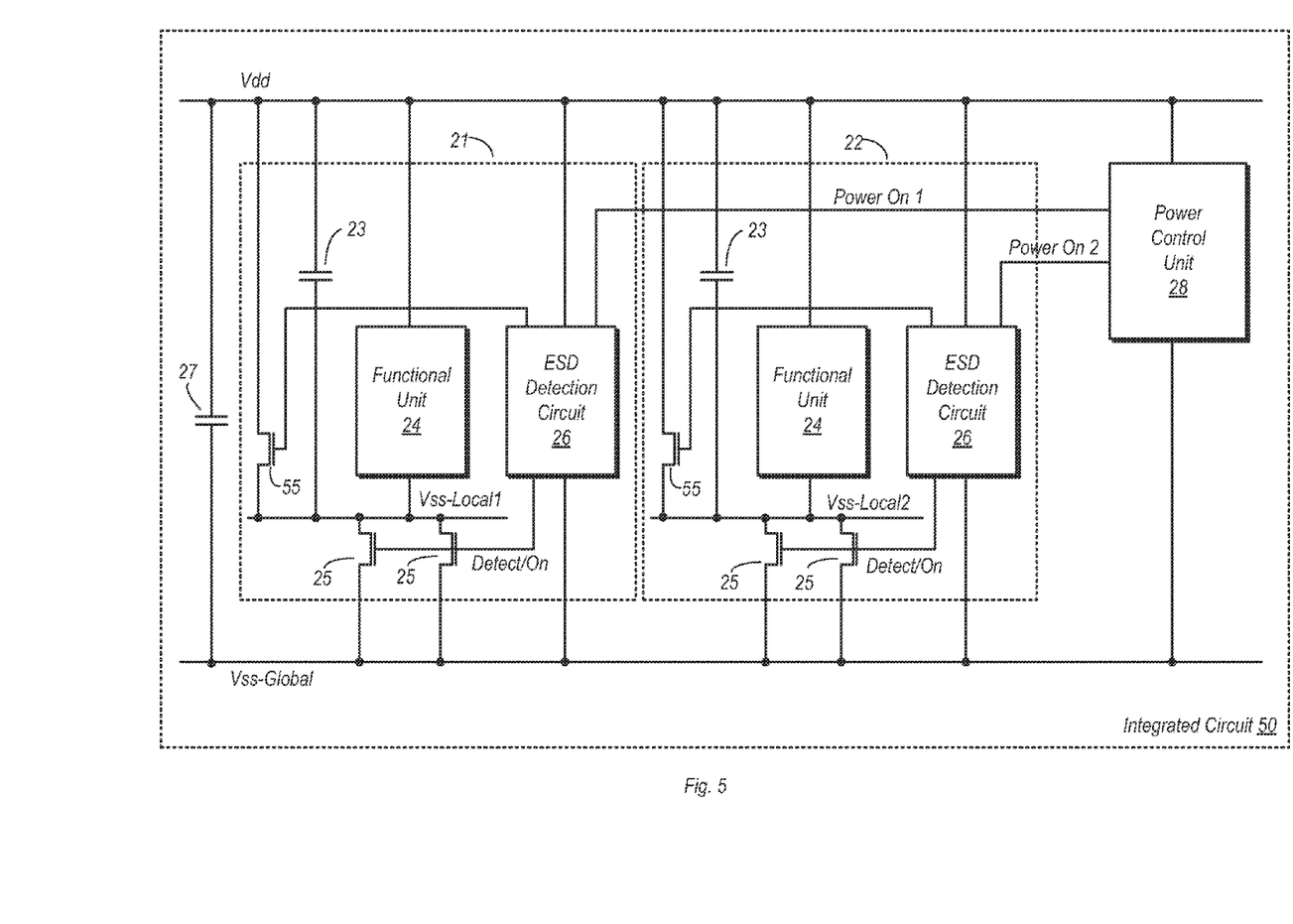
FIG. 5 is a diagram illustrating another embodiment of an IC having a plurality of power domains which each utilize a power-gating transistor to provide an ESD discharge path.

FIG. 5 is a diagram illustrating another embodiment of an IC having a plurality of power domains which each utilize multiple power-gating transistors to provide an ESD discharge path. IC 50 in the embodiment shown is similar to IC 10 shown in FIG. 1, with like-numbered elements performing the same functions. However, power domains 21 and 22 in IC 50 each include multiple instances of power-gating transistor 25, instead of a single power-gating transistor 25 for power domains of IC 10. Implementing multiple instances of a power-gating transistor may in some embodiments allow these transistors to be smaller than in embodiments wherein only a single power-gating transistor is utilized.

In the embodiment shown, power domains 21 and 22 each include an additional transistor 55 that is coupled in parallel with decoupling capacitor 23. Each instance of transistor 55 includes a gate terminal coupled to its respective ESD circuit 26. More particularly, the gate terminals of each of transistors 55 may be coupled to the Event node, shown in the embodiment of FIG. 2, of the corresponding ESD circuit 26. Accordingly, transistors 55 in the embodiment shown are configured to be activated responsive only to an ESD event, in contrast to transistors 25, which may be activated to provide power to their respective power domains in addition to being activated responsive to an ESD event. When active, a given instance of transistor 55 may provide an additional discharge path between Vdd and the respective Vss-Local node, in parallel with the corresponding capacitor 23.

In general, a wide variety of embodiments of an IC may be implemented in accordance with the discussion above, wherein the function of power-gating transistors may double as ESD protection devices. Such power-gating transistors may be coupled between global voltage supply nodes and local voltage supply nodes, global ground nodes and local ground nodes, and/or other local and global voltage nodes. ESD circuits may be coupled to such power-gating transistors, and may enable their activation responsive to an ESD event in order to provide a discharge path and thus prevent damage to their respective power domains. The power-gating transistors may also be used to independently apply or remove power from their corresponding power domains.

Figure 6:
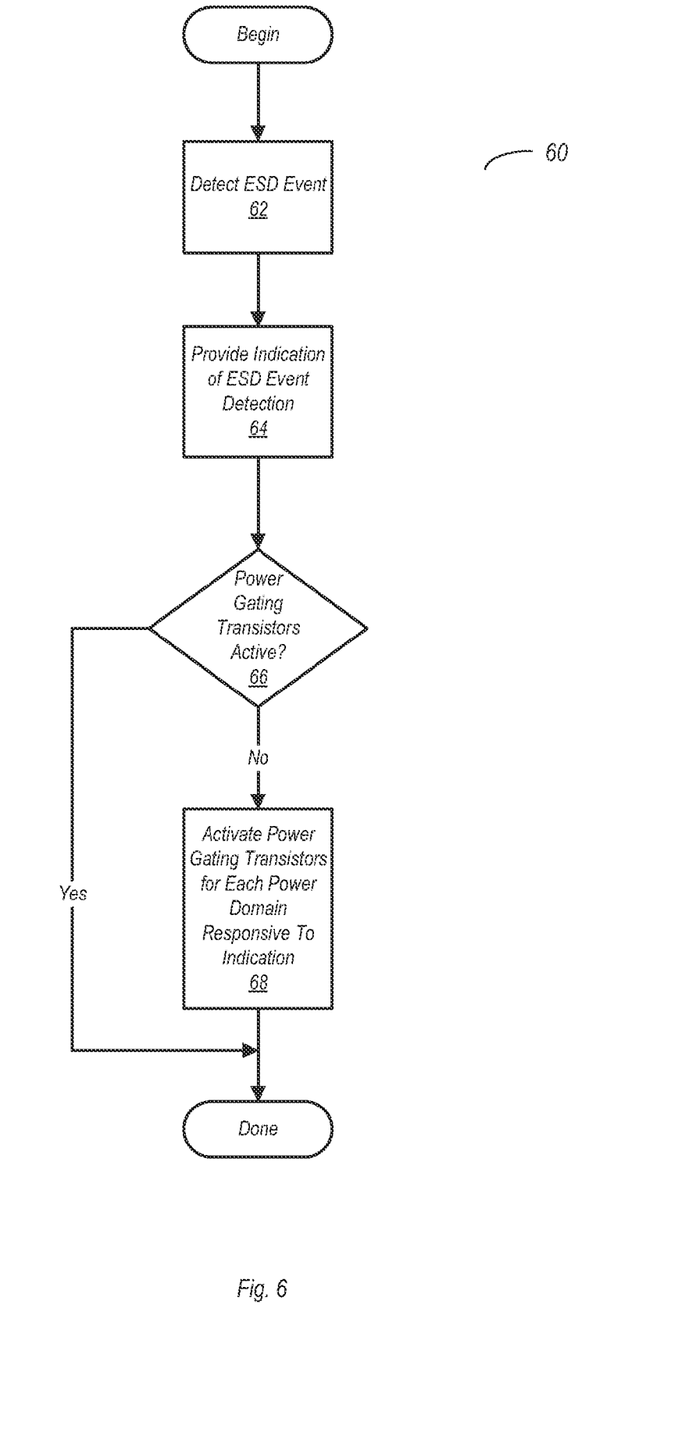
FIG. 6 is a flow diagram illustrating one embodiment of a method for providing an ESD discharge path in an IC.

Method Flow:

FIG. 6 is a flow diagram illustrating one embodiment of a method for providing an ESD discharge path in an IC. In the embodiment shown, method 60 begins with the detection of an ESD event (block 62). Responsive to the detection of an ESD event, and indication is generated (block 64) by one or more ESD detection circuits, each of which may be associated with a particular power domain. Each ESD detection circuit may be coupled to a corresponding power-gating transistor for the particular power domain. For a given power domain, if its respective power-gating transistor is not active when the ESD event is detected (block 66, no), then that power-gating transistor may be activated (block 68) in order to provide a discharge path for the current generated by the ESD event. If the some or all of the power-gating transistors associated with corresponding power domains are already active when the ESD event occurs (block 66, yes), then no further action need be taken for these power domains, as a discharge path is already provided through the active power-gating transistors as well as through corresponding decoupling capacitance. It is noted that since the power-gating transistors for each domain may be activated or de-activated independent of those associated with other power domains, some may be active at a given time while others are inactive. Thus, at times it may be necessary to momentarily activate otherwise inactive power-gating transistors when an ESD event occurs while others are already active.

Figure 7:
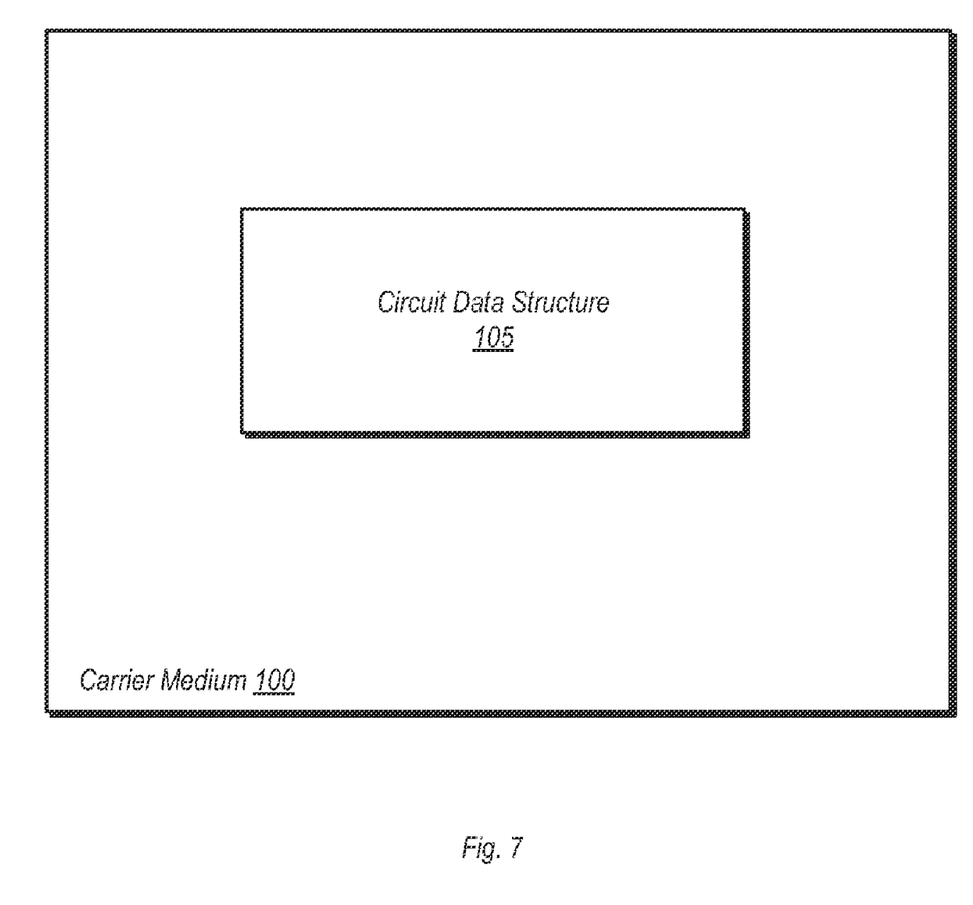
FIG. 7 is a block diagram of one embodiment of a carrier medium storing a data structure representative of an embodiment of an IC.

Computer Accessible Storage Medium:

Turning next to FIG. 7, a block diagram is shown of a computer accessible storage medium 300 including a database representative of any one (or all) of IC's 10, 40, or 50 as discussed above. Generally speaking, a computer accessible storage medium may include any non-transitory storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LP-DDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, the database or other type of data structure representative of the IC 10, 40, and/or 50 carried on the computer accessible storage medium 300 may be a database which can be read by a program and used, directly or indirectly, to fabricate the hardware comprising the described IC(s). For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates and other circuits from a synthesis library. The netlist comprises a set of gates and other circuitry which also represent the functionality of the hardware comprising the described IC(s). The netlist may then be placed and routed to produce a data set describing geometric shapes to be applied to masks. The masks may then be used in various semiconductor fabrication steps to produce a semiconductor circuit or circuits corresponding to the described IC(s). Alternatively, the database on the computer accessible storage medium 300 may be the netlist (with or without the synthesis library) or the data set, as desired.

While the computer accessible storage medium 300 carries a representation of one or more of ICs 10, 40, and/or 50, other embodiments may carry a representation of any portion of these ICs, as desired, including any set of agents (e.g. ESD circuit 26, power control unit 28, functional unit 24, etc.), portions of an agent (e.g., OR gate 31), and so forth.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
    a first global voltage node and a second global voltage node;
    two or more power domains each coupled to the first global voltage node, wherein each of the two or more power domains includes:
        a local voltage node;
        one or more decoupling capacitors coupled between the first voltage node and its respective local voltage node;
        a first transistor coupled between the local voltage node and the second global voltage node;
        a second transistor coupled between the first voltage node and its respective local voltage node; and
        an ESD (electrostatic discharge) circuit configured to detect an occurrence of an ESD event and further configured to cause activation of each of the first and second transistors responsive to detecting the ESD event.

2. The integrated circuit as recited in claim 1, wherein each of the power domains includes a functional unit coupled between the first global voltage node and its respective local voltage node, and wherein the ESD circuit of each of the power domains is further configured to provide power to the functional unit of its respective one of the plurality of power domains by activating the first transistor responsive to receiving a first indication from a power control unit of the integrated circuit.

3. The integrated circuit as recited in claim 2, wherein, in absence of an ESD event, the first transistor is configured to be inactive responsive to the ESD circuit receiving a second indication from the power control unit.

4. The integrated circuit as recited in claim 2, wherein the power control unit is further configured to control powering on and off of the plurality of power domains independently of one another, wherein powering on a particular one of the plurality of power domains comprises providing the first indication to the ESD circuit of that one of the plurality of power domains, and wherein removing power from the particular one of the plurality of power domains comprises providing a second indication to the ESD circuit of that one of the plurality of power domains.

5. The integrated circuit as recited in claim 2, wherein the ESD circuit includes:
    an RC (resistive-capacitive) circuit having a resistor and a capacitor coupled in series between the first global voltage node and the second global voltage node; and
    a logic gate having a first input coupled to a junction of the resistor and the capacitor.

6. The integrated circuit as recited in claim 5, wherein the logic gate further includes a second input coupled to receive the first indication from the power control unit.

7. The integrated circuit as recited in claim 1 wherein the first global voltage node is a power supply node, wherein the second global voltage node is a return node.

8. The integrated circuit as recited in claim 1, wherein the first global voltage node is a return node and wherein the second global voltage node is a voltage supply node.

9. A method comprising:
    an ESD (electrostatic discharge) circuit detecting an ESD event, wherein the ESD circuit is associated with one of a plurality of power domains of an integrated circuit (IC), wherein each of the plurality of power domains is associated with a corresponding one of a plurality of ESD circuits and is coupled between a first global voltage node and a second global voltage node; and providing a discharge path between the second global voltage node a local voltage node of the one of plurality of power domain responsive to detecting the ESD event, wherein said providing the discharge path comprises the ESD circuit activating two or more transistors each coupled between the local voltage node and the second global voltage node.

10. The method as recited in claim 9, further comprising the ESD circuit activating the one or more transistors of coupled between the local voltage node and the second global voltage node responsive to receiving a first indication from a power control unit.

11. The method as recited in claim 10, further comprising the power control unit powering on particular ones of the plurality of power domains independent of one another, and further comprising the power control unit independently powering down particular ones of the plurality of power domains independently of one another by providing a second indication to the particular ones of the plurality of power domains.

12. The method as recited in claim 9, wherein activating the two or more transistors comprises coupling a global supply voltage node to a local supply voltage node, wherein the second global voltage node is the global supply voltage node and wherein the first global voltage node is a return voltage node.

13. The method as recited in claim 9, wherein activating the two or more transistors comprises coupling a global return voltage node to a local return voltage node, wherein the second global voltage node is the global return voltage node, and wherein the first global voltage node is a supply voltage node.

14. A non-transitory computer readable medium storing a data structure which is operated upon by a program executable on a computer system, the program operating on the data structure to perform a portion of a process to fabricate an integrated circuit including circuitry described by the data structure, the circuitry described in the data structure including:

an integrated circuit (IC) having a first global voltage node and a second global voltage node;

two or more power domains each coupled to the first global voltage node, wherein each of the two or more power domains includes:

a local voltage node;

two or more transistors each coupled between the local voltage node and the second global voltage node; and an ESD (electrostatic discharge) circuit configured to detect an occurrence of an ESD event and further configured to cause activation of the two or more transistors responsive to detecting the ESD event or responsive to receiving a corresponding indication from a power control unit.

15. The computer readable medium as recited in claim 14, wherein the ESD circuit described in the data structure is further configured provide power to a functional unit of its respective one of the plurality of power domains by activating the transistor responsive to receiving a first indication from a power control unit of the integrated circuit, wherein the functional unit of each of the power domains is coupled between the first global voltage node and its respective local voltage node.

16. The computer readable medium as recited in claim 15, wherein the power control unit described in the data structure is further configured to power on each of the plurality of power domains independently of one another, wherein powering on a particular one of the plurality of power domains comprises providing the first indication to the ESD circuit of that one of the plurality of power domains, and wherein removing power from the particular one of the plurality of power domains comprises providing a second indication to the ESD circuit of that one of the plurality of power domains.

17. The computer readable medium as recited in claim 14, wherein the data structure comprises one or more of the following types of data:

HDL (high-level design language) data;
RTL (register transfer level) data;
Graphic Data System (GDS) II data.

* * * * *